United States Patent [19]
Bohnert et al.

[11] Patent Number: 4,929,830
[45] Date of Patent: May 29, 1990

[54] FIBER-OPTIC ELECTRIC FIELD SENSOR WITH PIEZOELECTRIC BODY SENSOR

[75] Inventors: Klaus Bohnert, Niederrohrdorf; Meinolph Kaufmann, Baden; Jürgen Nehring, Wettingen, all of Switzerland

[73] Assignee: Asea Brown Boveri AG, Baden, Switzerland

[21] Appl. No.: 267,299

[22] Filed: Nov. 4, 1988

[30] Foreign Application Priority Data

Nov. 5, 1987 [CH] Switzerland .................. 4322/87
May 2, 1988 [CH] Switzerland .................. 1628/88

[51] Int. Cl.$^5$ ............................................. H01J 5/16
[52] U.S. Cl. .................................. 250/227.14; 324/96
[58] Field of Search ............. 250/227, 231 R; 324/96

[56] References Cited

U.S. PATENT DOCUMENTS

| 4,319,186 | 3/1982 | Kingsley | 324/96 |
| 4,477,723 | 10/1984 | Carome | 324/96 |
| 4,524,322 | 6/1985 | Bobb | 324/96 |

OTHER PUBLICATIONS

IEEE Journal of Quantum Electronics, vol. QE-18, No. 4, Apr. 1982.
An Electric Field Sensor Utilizing A Piezoelectric Polyvinylidene Fluoride (PVF2) Film in a Single-Mode . . . pp. 670–675.
IEEE Journal of Quantum Electronics vol. QE-18 No. 10 Oct. 1982.
Fiber-Optic Fabry-Perot Interferometer And Its Sensor Applications Yoshino, et al. pp. 1624–1633.
Electronics Letters Apr. 15th 1982 vol. 18 No. 8 Electric Field Sensitive Optical Fibre Using Piezoelectric Polymer Coating. pp. 327–328.
The Optical Society of America-Optic Letters vol. 12 No. 9 Strain Effects On Highly Elliptical Core Two-Mode Fibers Blake, et al., pp. 732–734, Sep. 1987.
Optical Society of America/Optics Letters Sep. 1987 vol. 12, No. 9.
Use of Highly Elliptical Core Fibers For Two-Mode Fiber Devices Kim, et al., pp. 729–731.

*Primary Examiner*—David C. Nelms
*Assistant Examiner*—Sherrie Hsia
*Attorney, Agent, or Firm*—Oblon, Spivak, McClelland, Maier & Neustadt

[57] ABSTRACT

A fibre-optic sensor for measuring a particular directional component of an electric field comprises a piezoelectric body (4) and a glass fiber (5a) which is rigidly connected to the piezoelectric body (4) in a given length section. A crystal class and a crystallographic orientation of the piezoelectric body (4) is selected in such a manner that only the directional component which is parallel to a given body axis (h) of the piezoelectric body (4) causes a change in a length of the glass fiber (a) by means of an inverse piezoelectric effect. The change in length is measured interferometrically. In a preferred embodiment, the piezoelectric body has the shape of a disk, of a plate or of a hollow cylinder.

10 Claims, 2 Drawing Sheets

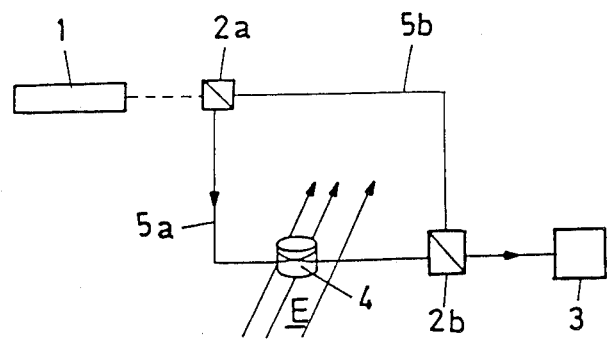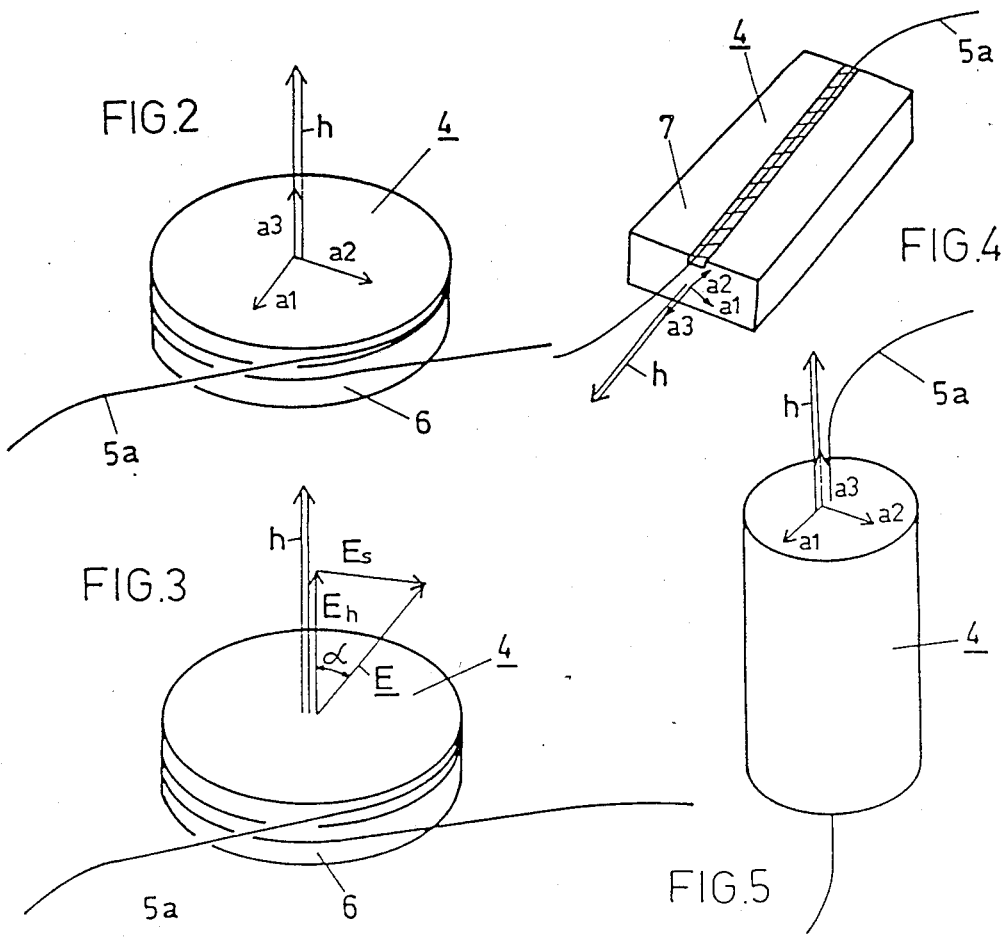

FIBER-OPTIC ELECTRIC FIELD SENSOR WITH PIEZOELECTRIC BODY SENSOR

BACKGROUND OF THE INVENTION

1. Field of the Invention

The invention relates to a fiber-optic sensor for measuring a predetermined directional component of an electric field, this sensor comprising a piezoelectronic body, a glass fiber which is rigidly connected to the piezoelectric body in a given link section, and means for detecting a change in the length of the glass fiber.

2. Discussion of Background

Electro-optical effects such as the Pockets effect or the Kerr effect are available for measuring electric field strengths. In this connection, the effect can be utilised that the index of refraction changes linearly (Pockels effect) or quadratically (Kerr effect) with an applied field strength in certain materials. If these materials also have particular characteristics of symmetry, a predetermined directional component of an electric field can also be measured. Whilst so called Pockels sensors require expensive monocrystalline materials of high optical quality which are in many cases sensitive to environmental influences (for example moisture), so called Kerr sensors are mainly suitable for high field strengths because of their low sensitivity. These disadvantages can be circumvented if the electric field strength is measured by means of the inverse piezoeffect. For this purpose, a dimensional change of a piezoelectric body in the electric field is transferred to a change in the length of a glass fiber which can be measured by interferometric means.

In this connection, reference is made to the publication "Fiber-optic Fabry-Perot interferometer and its Sensor Application" T. Yoshino et al. IEEE J. of Quant. Electr. QU-18 1624 (1982). In this publication it is proposed to wind a fiber-optic Fabry-Perot interferometer around a disk of a piezoelectric ceramic, called PZT, and to apply an alternating voltage to the disk. The periodic change in dimension of the PZT leads to periodic intensity fluctuations of the light coupled in the fiber-optic Fabry-Perot interferometer.

Another printed document, "Electric Field Sensitive Optical Fibre Using Piezoelectric Polymer Coating" L. J. Donalds et. al. Electr. Lett 18, 327 (1982), discloses a measuring arrangement in which a glass fiber covered by a piezoelectric polymer and a Mach-Zehnder interferometer are used for determining an electric field strength.

All known piezoelectric sensors measure the amount of the field strength when the direction of the electric field is known. However, they cannot be used if both the amount and the direction of the electric field are to be determined.

SUMMARY OF THE INVENTION

The invention has the object of specifying a fiber-optic sensor for measuring a pre-determined directional component of an electric field, this sensor comprising a piezoelectric body, a glass fiber which is rigidly connected to the piezoelectric body in a given length section, and means for detecting a change in the length of the glass fiber, this sensor only accurately measuring the directional component of the electric field which is located in a direction which is freely predeterminable by the sensor.

According to the invention, the object is achieved by means of the fact that the piezoelectric body belongs to one of the crystal classes C2, C2v, C3, Cv3, D3, D3h, C4, C6, C∞, C4v, C6v, C∞v, T, Td, S4, D2, D2d, D4, D6, D∞ and that, on the one hand, a crystallographic orientation of the piezoelectric body with respect to the predetermined directional component and, on the other hand, the given length section of the glass fiber with respect to the crystallographic orientation is selected in such a manner that a component of the electric field which is perpendicular to the predetermined direction does not cause any change in the length of the glass fiber.

Particularly suitable embodiments of the invention are obtained with a piezoelectric body in the form of a disk, a plate or a hollow cylinder.

According to a preferred embodiment, the piezoelectric body consists of PVDF (polyvinylidene fluoride), PZT (piezoelectric ceramic), lithium niobate ($LiNbO_3$) or of $\alpha$-quartz.

The glass fiber is preferably connected to the piezoelectric body in the given length section in such a manner that a dimensional change of the piezoelectric body causes the greatest possible change in the length of the glass fiber.

A large number of preferred embodiments results from the subclaims.

BRIEF DESCRIPTION OF THE DRAWING

In the text which follows, the invention will be explained in greater detail with reference to illustrative embodiments in conjunction with the drawing, in which:

FIG. 1 shows an arrangement according to the invention for measuring a directional component of an electric field;

FIG. 2 shows a fiber-optic sensor with a piezoelectric body in the form of a disk;

FIG. 3 shows a representation of the operation of the fiber-optic sensor according to FIG. 2;

FIG. 4 shows a fiber-optic sensor with a piezoelectric body in the form of a plate;

FIG. 5 shows a fiber-optic sensor with a piezoelectric body in the form of a hollow cylinder;

DESCRIPTION OF THE PREFERRED EMBODIMENTS

Figure 6A:
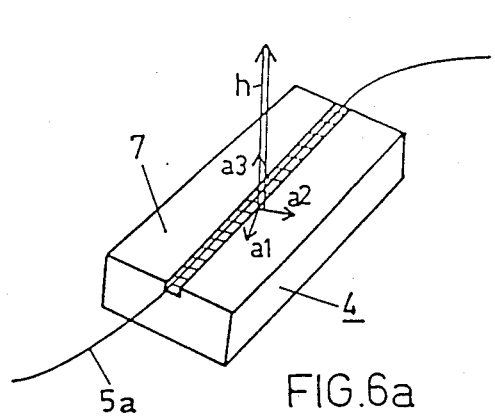
FIGS. 6a–e show a fiber-optic sensors with a piezoelectric body in the form of a plate in which one body axis is parallel to a plate normal.

In a first illustrative embodiment, a fiber-optic sensor with a piezoelectric body in the form of a disk is described.

FIG. 1 shows an arrangement according to the invention for measuring a directional component of an electric field. A laser 1 supplies coherent light. This is divided into two partial waves by means of a first beam divider 2a in a manner typical of a Mach-Zehnder interferometer. A first partial wave is coupled into a first polarisation-maintaining glass fiber 5a and a second partial wave is coupled into a second glass fiber 5b. The first glass fiber 5a is used as fiber-optic sensor. It is rigidly connected to a piezoelectric body 4 in a given length section. The second glass fiber 5b is used as reference path. The two partial waves are coherently superimposed in a beam divider 2b and fed to a detector 3.

If, for example, an alternating electric field acts on the piezoelectric body 4, this effects a periodic change of a length of the glass fiber 5a due to the inverse piezoelectric effect. The change in length in turn, generates a phase shift of the partial wave running through the glass fiber 5a. As a consequence, the intensity of the light emerging from the beam divider 2b changes and this is finally measured in the detector 3. Since the phase shift is directly proportional to the field strength with a given direction of the electric field, the field strength can be easily inferred from the measured intensity.

FIG. 2 shows the actual fiber-optic sensor. The piezoelectric body 4 has the form of a disk. The glass fiber 5a is attached with the given length section to a disk edge fixed under a mechanical pretension. The glass fiber 5a is preferably wound several times around the disk (twice in this example). In this manner the effect of a change in the circumference of the disk on the phase shift is multiplied.

The core of the invention consists in matching the shape of the piezoelectric body, the type and manner in which the glass fiber 5a is attached to the piezoelectric body 4 and a crystal class and a crystallographic orientation of the material of which the piezoelectric body consists, to one another in such a manner that the piezoelectric body has exactly one body axis which is distinguished by the feature that only one directional component of the electric field can act by means of the inverse piezoelectric effect on the glass fiber 5a which is parallel to this body axis. Directional components of the electric field which are perpendicular to this body axis cannot change the length of the glass fiber 5a.

An orthogonal system of coordinates, by means of which an orientation of the crystal can be described, can be allocated in familiar manner to a crystal. In FIG. 2 the select orientation of the crystal is specified by three orthogonal axes a1, a2, a3. The axis a3 is parallel to a disk normal. The two axes a1, a2 are thus located in a plane which is parallel to a principal surface of the disk. Its orientation in this plane is arbitrary. The body axis h is parallel to the disk normal.

Table I specifies the crystal classes which are suitable for a piezoelectric body in the shape of a disk and how the crystallographic orientation should be selected in each case. The Schoenflies or international notation respectively, is used for designating the crystal classes. With each crystal class, the crystallographic axis (X axis/Y axis/Z axis) represented by the axis a3 is specified. The designation of the crystallographic axes corresponds to the convention used as a basis in the book "Physical Properties of Crystals" J. F. Nye, Oxford University Press, 1967.

TABLE I

| Crystal class (Schoenflies [international]) | Speed of axis a3 | Axis a3 corresponds to the crystallographic |
|---|---|---|
| C2v | [2 mm] | 2 | |
| C4v | [4 mm] | 4 | |
| C4 | [4] | 4 | |
| C3 | [3] | 3 | |
| C3v | [3 m] | 3 | Z axis |
| C6 | [6] | 6 | |
| C6v | [6 mm] | 6 | |
| C∞ | [∞] | ∞ | |
| C∞v | [∞ mm] | ∞ | |
| C2 | [2] | 2 | |
| D3h | [6̄2 m] | 2 | Y axis |

TABLE I-continued

| Crystal class (Schoenflies [international]) | Speed of axis a3 | Axis a3 corresponds to the crystallographic |
|---|---|---|
| D3 | [32] | 2 | X axis |

FIG. 3 shows a representation of the operation of the fiber optic sensor. An electric field with a field vector E is assumed to act in the direction drawn at the location of the fiber-optic sensor and to enclose an angle a with the body axis h. The field vector E can be split into a directional component Eh which is parallel to the body axis h and into a directional component Es which is perpendicular thereto. However, the fiber-optic sensor only, "sees" the directional component Eh since this is the only one which leads to a change in the circumference of the disk by means of the inverse piezoelectric effect. Thus, the orientation of the body axis h that is to say of the disk normal, determines which directional component of the electric field is measured.

The piezoelectric body 4 preferably consists of electrically polarised and mechanically stretched PVDF (polyvinylidenfluoride, crystal class C2v), of the quartz (crystal class D3), of a piezoelectric ceramic (PZT, crystal class C∞v) or of lithium niobate (LiNbo$_3$, crystal class C3v). In a suitable illustrative embodiment, the disk has a diameter of about 10 mm and a thickness of 1–3 mm. If the piezoelectric body consists of, for example, PVDF and if the PVDF is stretched in the crystallographic Y axis and polarised in the crystallographic Z axis, an electric field of 1 V/cm covers a change in circumference of approximately 0.03 Å. If the glass fiber is wound 10 times around the disk, this leads to a phase shift of about 4 10$_{-4}$ rad at a wave length of 630 nm.

In the text which follows, further preferred embodiments of the fiber-optic sensor are described. In a second illustrative embodiment, a fiber-optic sensor is presented which has a piezoelectric body 4 in the form of a plate. A directional component of the electric field which is parallel to the glass fiber 5a is measured.

FIG. 4 shows a corresponding fiber-optic sensor. The piezoelectric body 4 has the form of an elongated plate. The glass fiber 5a is attached in a longitudinal direction along a straight line to a principal face 7 of the plate. To attach the glass fiber 5a, the plate can be provided, for example, with a straight groove into which the glass fiber 5a is inserted and cast with an adhesive agent. A crystallographic orientation is again represented by the three axes a1, a2, a3. The body axis h is located in the direction of the straight line along which the given length section of the glass fiber 5a is bonded to the plate, that is to say parallel to the glass fiber 5a, in this case in the longitudinal direction of the plate.

Table I also shows how the crystallographic orientation of the piezoelectric body 4 should be selected for various crystal classes. The two axes a1 and a2 are perpendicular to the body axis h but otherwise have an arbitrary orientation. The result is that the piezoelectric body can also have a different elongated shape as long as the abovementioned conditions (Table I) are met.

FIG. 5 shows an embodiment which is equivalent to FIG. 4 and in which the piezoelectric body 4 is constructed as a hollow cylinder. The glass fiber 5a is fixed in the hollow cylinder, for example by means of an adhesive agent.

In a third illustrative embodiment, a fiber-optic sensor is described in which the piezoelectric body 4 also has the form of a plate but in which a directional component of the electric field which is parallel to a plate normal is measured.

Figure 6B:
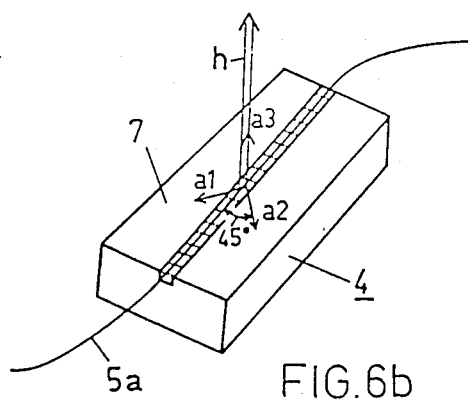
Figure 6C:
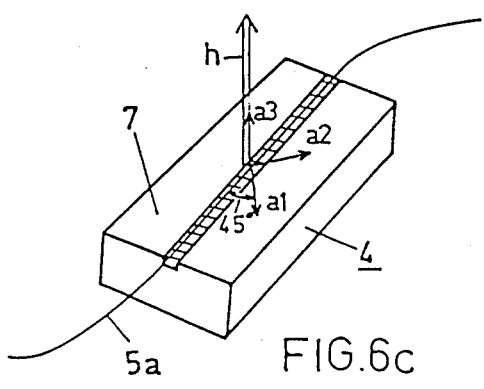

FIGS. 6a–c shows three further illustrative embodiments of such fiber-optic sensors. Externally they do not differ from that shown in FIG. 4. This is why identical parts are provided with identical reference symbols. They differ in each case by means of the crystallographic orientation shown by three axes a1, a2, a3 which are orthogonal in pairs. As has already been said, the body axis h is always perpendicular to a principal face of the plate, that is to say parallel to a plate normal.

In FIG. 6a, the axis a3 is a crystallographic Z axis or Y axis (depending on crystal class). The two other axes a1, a2 are in a plane parallel to the principal face of the plate. Its orientation is arbitrary. In Table II the crystal classes are listed for which the embodiment described above is suitable. It should be noted that the crystal class C2 is the only one in which the axis a3 corresponds to the crystallographic Y axis.

TABLE II

| Crystal class (Schoenflies [international]) | Speed of axis a3 | Axis a3 corresponds to the crystallographic |
|---|---|---|
| C2v [2 mm] | 2 | |
| C4v [4 mm] | 4 | |
| C4 [4] | 4 | |
| C6 [6] | 6 | Z axis |
| C6v [6 mm] | 6 | |
| C∞ [∞] | ∞ | |
| C∞V [∞ mm] | ∞ | |
| C2 [2] | 2 | Y axis |

In the previous illustrative embodiments, the direction of only one crystallographic axis was determined in each case. In those now following, two axial directions are in each case predetermined, namely a crystallographic axis which is parallel to the body axis h and a second crystallographic axis which is in an accurately determined direction with respect to the glass fiber 5a.

FIGS. 6b and c show the embodiments suitable for crystal class D2, D2d, T, Td, D4, D6 (Schoenflies Notation). In these crystal classes, the direction of the glass fiber 5a is required to be located in the direction of an angle bisector of the two axes a1 and a2. Table III contains the crystallographic orientation suitable for the crystal classes named.

TABLE III

| Crystal class (Schoenflies [international]) | Axis a3 corresponds to the crystallographic | Glass fiber in direction |
|---|---|---|
| S4 [4] | Z axis | cryst. X axis |
|  |  | cryst. Y axis |
| D3 [32] |  |  |
| D3h [62 m] | X axis | cryst. Y axis |
| D2 [222] | X axis | Wyz or W-yz |
| D2d [42 m] |  |  |
| T [23] | Y axis | Wzx or W-zx |
| Td [43 m] | Z axis | Wxy or W-xy |
| D4 [422] | X axis | Wyz or W-yz |
| D6 [622] | Y axis | Wzx or W-zx |

For all crystal classes D2, D2d, T, Td, the axis a3 can correspond either to a crystallographic X axis, a crystallographic Y axis or a crystallographic Z axis. If, for example, the axis a3 is the crystallographic X axis, the glass fiber must lie in the direction of an angle bisector Wyz, W-yz of the crystallographic X and Y axis. The angle bisector Wyz designated the angle bisector which is located between the positive Y axis and the positive Z axis and the angle bisector W-yz denotes that which is located between the negative Y axis and the positive Z axis. The two angle bisectors Wyz and W-yz are perpendicular to one another. The angle bisector Wzx, W-zx, Wxy, W-xy should be understood in analogous manner.

The two crystal classes D4, D6 differ from crystal classes D2, D2d, T, Td in that the third variant does not exist, namely that the crystallographic Z axis corresponds to the axis a3 and the glass fiber is located in the direction of an angle bisector Wxy, W-xy.

Figure 6E:
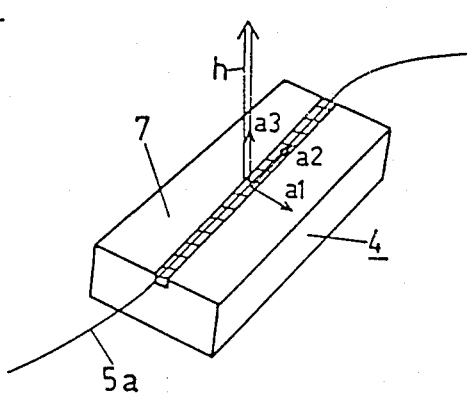
Figure 6D:
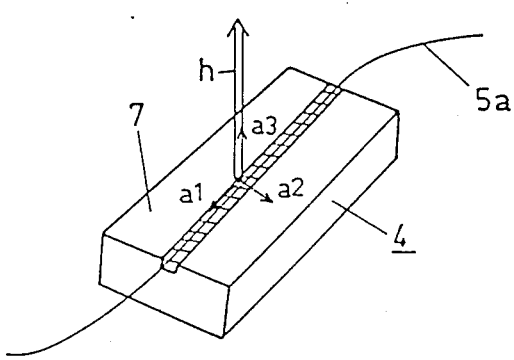

In FIG. 6d the crystallographic orientation suitable for crystal classes D3, D3h is shown. The axis a1 is in this case parallel to the glass fiber 5a. The axis a3 is the crystallographic X axis and the axis a1 is the crystallographic Y axis (see Table III).

In FIG. 6e finally, the crystallographic orientations suitable for crystal classes 4 are shown. The axis a3 is the crystallographic Z axis. The glass fiber is either in the direction of the crystallographic X axis (FIG. 6b) or in the direction of the crystallographic Y axis (FIG. 6e).

Further investigations have shown that the two crystal classes T and Td are also suitable for the second embodiment in which a directional component of the electric field parallel to the glass fiber 5a is measured (FIG. 4 and FIG. 5).

The Table 1 shown above will be replaced by two new tables IV and V to illustrate this fact.

According to the representation, the new tables following differ from the old tables in that reference is no longer made to a system of coordinates forming the basis for the crystal (with crystallographic X, Y and Z axis) but, as far as possible, directly to the axes of symmetry (axes of rotation).

The content of the following Table IV completely corresponds to Table I. It specifies the crystal classes which are suitable for a piezoelectric body (4) in the form of a disk and how the crystallographic orientation with respect to the disk normal should be selected.

TABLE IV

| Crystal class (Schoenflies [international]) | Axis of rotation parallel to the disk normal |
|---|---|
| C2 [2] | 2-fold axis |
| C2v [2 mm] | 2-fold axis |
| C3 [3] | 3-fold axis |
| C3v [3 m] | 3-fold axis |
| D3 [32] | 2-fold axis |
| D3h [62 m] | 2-fold axis |
| C4 [4] | 4-fold axis |
| C6 [6] | 6-fold axis |
| C∞ [∞] | ∞-fold axis |
| C4v [4 mm] | 4-fold axis |
| C6v [6 mm] | 6-fold axis |
| C∞V [∞ mm] | ∞-fold axis |

Table V corresponds to Table I extended by the two crystal classes T, Td. It specifies the crystal classes which are suitable for the embodiments in which a component of the electric field is measured which is parallel to the glass fiber or in the longitudinal direction of the plate, respectively (FIG. 4, FIG. 5). Only the orientation of the axis of rotation which is parallel to the glass fiber is determined, the orientation of the remaining axes of rotation is arbitrary.

TABLE V

| Crystal classes (Schoenflies [international]) | | Axis of rotation parallel to the glass fiber |
|---|---|---|
| C2 | [2] | 2-fold axis |
| C2v | [2 mm] | 2-fold axis |
| C3 | [3] | 3-fold axis |
| C3v | [3 m] | 3-fold axis |
| D3 | [32] | 2-fold axis |
| D3h | [6̄2 m] | 2-fold axis |
| C4 | [4] | 4-fold axis |
| C6 | [6] | 6-fold axis |
| C∞ | [∞] | ∞-fold axis |
| C4v | [4 mm] | 4-fold axis |
| C6v | [6 mm] | 6-fold axis |
| C∞v | [∞mm] | ∞-fold axis |
| T | [23] | 3-fold axis |
| Td | [4̄3] | 3-fold axis |

The dimension will be explained again on the example of a disk-shaped sensor (FIG. 2) comprising a piezoelectric body of crystal class D3 (for example quartz).

As is known, the matrix of the piezoelectric coefficients of expansion is in this case (see for example, J. F. Nye):

| d11 | −d11 | 0 | d14 | 0 | 0 |
|---|---|---|---|---|---|
| 0 | 0 | 0 | 0 | −d14 | −2d11 |
| 0 | 0 | 0 | 0 | 0 | 0 |

An electric field located in the direction of a crystallographic X axis (2-fold axis) thus generates a longitudinal expansion in the direction of the X axis, a transverse expansion in the direction of the Y axis and a (longitudinal) shear around the X axis (that is to say a shear in a Y-Z plane).

An electric field in the direction of the crystallographic axis causes a shear around the Y axis and one around the Z axis.

An electric field in the direction of the crystallographic Z axis (3-fold axis), finally, generates no expansion at all.

To detect only the directional components parallel to the disk normal then, a crystallographic X axis must be parallel to the disk normal. The transverse expansion caused by a component of the electric field occurring which is parallel to the disk normal is then the only possible influence of the field on a change in the circumference of the disk and thus on a change in the length of the glass fiber. Shears generated by a field along the axis have no influence on the circumference of the disk.

$$\frac{L}{L} = -\frac{1}{2} d11\, E(x,in)$$

is obtained for the relative change in the circumference, E(x, in) designating the component of the electric field which is located in the piezoelectric body in the direction with respect to the disk normal which is identical with a 2-fold axis of rotation. The factor ½ follows from the fact that the corresponding expansion does not act regularly but only along the Y axis.

The operation of all other embodiments can also be illustrated in analogous manner.

For reasons of clarity of the representation, the embodiments described by the two Tables II and III have been combined in the subsequent Tables VIa and VIb which have been further completed by the crystal class D∞. Tables VIa and VIb specify the crystal classes which are suitable for the embodiments in which the piezoelectric body has the form of a plate and a directional component of the electric field which is perpendicular to the glass fiber is measured (FIG. 6a–e). An axis of rotation which is parallel ( $\parallel$ ) or perpendicular ( $\perp$ ), respectively, to the predetermined directional component and the direction of the glass fiber with respect to the crystallographic orientation are determined. Since generally several directions are possible for the glass fiber, the relative change in the length of the glass fiber depending on its direction, the direction in which the change in length disappears is additionally specified, if necessary. The glass fiber must not be orientated in this direction. Correspondingly, there is a direction in which the glass fiber experiences a maximum elongation. In each case, the given length section of the glass fiber, however, is perpendicular to the predetermined directional component. Not in every case is there an inadmissible orientation of the glass fiber for crystal classes C2v. If for instance, d23 and d21 or d32 and d31 have the same sign, the ratio and the square root is negative. This means that there is no inadmissable angle α.

TABLE VIa

| Crystal class (Schoenflies [international]) | Axis of rotation $\parallel$ or $\perp$ Inadmissable to the predetermined directional component | orientation of the glass fiber |
|---|---|---|
| C2 [2] | $\parallel$ 2-fold axis | d23 cos²α + d21 sin²α + d25 sin²α = 0* |
| C2v [2 mm] | $\parallel$ 2-fold axis | tanα = $\sqrt{-d32/d31}$ ** |
| S4 [4̄] | $\perp$ and $\parallel$ 4̄-fold axis | tan 2α = −d31/d36** |
| C4 [4] | $\parallel$ 4-fold axis | |
| C6 [6] | $\parallel$ 6-fold axis | |
| C∞ [∞] | $\parallel$ ∞-fold axis | |
| C4v [4 mm] | $\parallel$ 4-fold axis | |
| C6v [6 mm] | $\parallel$ 6-fold axis | |
| C∞v [∞ mm] | $\parallel$ ∞ fold axis | |
| D3 [32] | $\parallel$ 2-fold axis | $\parallel$ 3-fold axis*** and tanα = 2d14/d11 |
| D3h [6̄2 m] | $\parallel$ 2-fold axis | $\parallel$ 3-fold axis |
| D2 [222] | $\parallel$ 2-fold axis | } $\parallel$ 2-fold axis |
| D2d [4̄2 m] | $\parallel$ 2-fold axis | |
| T [23] | $\parallel$ 2-fold axis | $\parallel$ 2-fold axis |
| Td [4̄3 m] | $\parallel$ 4-fold axis | $\parallel$ 4-fold axis |
| D4 [422] | $\perp$ 4-fold axis | $\parallel$ and $\perp$ 4-fold axis |
| D6 [622] | $\perp$ 6-fold axis | $\parallel$ and $\perp$ 6-fold axis |
| D∞ [∞22] | $\perp$ ∞-fold axis | $\parallel$ and $\perp$ ∞-fold axis |

*α = Angle between Z-axis and glass fiber
**α = Angle between X-axis and glass fiber
***α = Angle between 3-fold axis and glass fiber
dij = Piezoelectric coefficients of expansion
The angle is positive if the axis is rotated in the counter clockwise direction compared with the glass fiber.

TABLE VIb

| Crystal class (Schoenflies [international]) | | Axis of rotation or with resp. to the directional component | Direction of the glass fiber for maximum expansion |
|---|---|---|---|
| C2 | [2] | $\parallel$ 2-fold axis | Depending on the ratio of the co-efficients of expansion |
| C2v | [2 mm] | $\parallel$ 2-fold axis | |
| S4 | [4̄-fold axis] | | |
| C4 | [4] | $\parallel$ 4-fold axis | |
| C6 | [6] | $\parallel$ 6-fold axis | |
| C∞ | [∞] | $\parallel$ ∞-fold axis | |

TABLE VIb-continued

| Crystal class (Schoenflies [international]) | Axis of rotation or with resp. to the directional component | Direction of the glass fiber for maximum expansion |
|---|---|---|
| C4v [4 mm] | ‖ 4-fold axis | arbitrary |
| C6v [6 mm] | ‖ 6-fold axis | |
| C∞ [∞ mm] | ‖ ∞-fold axis | |
| D3 [32] | ‖ 2-fold axis | depending on d14/d11 |
| D3h [62 m] | ‖ 2-fold axis | ⊥ 3-fold axis |
| D2 [222] | ‖ 2-fold axis | 45° w.resp. 2-fold axis |
| D2d [42 m] | ‖ 2-fold axis | |
| T [23] | ‖ 2-fold axis | 45° w.resp. 2-fold axis |
| Td [43 m] | ‖ 4-fold axis | 45° w.resp. 4-fold axis |
| D4 [422] | ⊥ 4-fold axis | 45° w.resp. 4-fold axis |
| D6 [622] | ⊥ 6-fold axis | 45° w.resp. 6-fold axis |
| D∞ [∞22] | ⊥ ∞-fold axis | 45° w.resp. ∞-fold axis |

It must benoted that two inadmissable directions which are perpendicular to one another are obtained for S4.

Finally, it must also be pointed out that the orientation of the glass fiber is arbitrary for crystal classes C4, C6, C∞, C4v, C6v, C∞v as long as it is perperndicular to the predetermined directional component, of course.

Two groups of particularly advantageous embodiments are obtained from Tables VIa and VIb for practical applications. In one, the plate normal is in each case selected parallel to the predetermined directional component (FIG. 6a–e) and in the other one it is selected perpendicular thereto.

Figure 7:
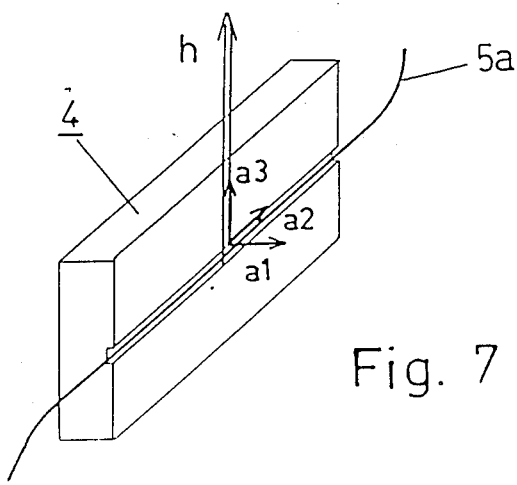
FIG. 7 shows a fibre-optic sensor with a piezoelectric body in the form of a plate in which one body axis is perpendicular to the plate normal.

FIG. 7 illustrates the principle of the last-mentioned arrangement. FIG. 7, for example, derives from FIG. 6e in such a manner that the plate of FIG. 6e is made narrower and narrower and, at the same time, thicker and thicker. This conceptual experiment makes it clear that for all embodiments according to FIG. 6a–e (plate normal parallel to the predetermined directional component), a corresponding one according to FIG. 7 axis (plate normal perpendicular to the predetermined directional component).

The commercially available piezoelectric materials suitable for the invention include α-quartz (D3), lithium niobate (C3v), barium titanate (C4v), GaAs (Td) and piezoelectric ceramics (PZT, C6v) and piezoelectric polymers PVDF and related substances (C2v).

For a high sensitivity of the sensor, the piezoelectric coefficients of expansion in dij should be large and have low relative permitivities εij with respect to a strong internal field E(x, in). The ratio between coefficient of expansion and electric permitivities is typically within a range of $0.1 \times 10^{-12}$ C/N(PZT) to $2^{-12}$ C/N(PVDF). Because of their high dielectric constants, PZTs are apparently slightly less attractive despite large coefficients of expansion. Quartz is in a middle range with $d11/\epsilon11 - 0.51 \times 10^{-12}$ C/N.

High dielectric constants εij do not only reduce the sensitivity of the sensor but can also cause significant distortion of the electric field to be measured. This is why quartz, because of its relatively low dielectric constant, has advantages which are not to be underestimated. To this is added a low temperature influence on coefficient of expansion and dielectric constant and a high electric resistance. This makes, for example, the influence of charge carrier migration which can lead to a frequency dependence of the polarization, negligibly small. Finally, quartz exhibits an excellent long-time stability.

It should be pointed out again at this point that the direction of the internal electric field in the piezoelectric body generally differs from the direction of the external field. There is only correspondence if the external field is parallel both to a (geometric) body axis and to a crystallographic axis. Nevertheless, the component of the internal field which is parallel to the disk normal or plate normal is always proportional to the cosine of the angle between the external field and the disk or plate normal or glass fiber. In this connection the factor of proportionality depends both on the relative permitivity and on the shape of the piezoelectric body.

If, in contrast, the preferred crystallographic orientation which is parallel to the predetermined directional component does not coincide with a body axis, there is no longer a simple relationship between body axis and measured directional component.

Naturally, the materials PVDF, PZT, LiNbO3 and ε-quartz and so forth are also suitable for piezoelectric bodies in the form of a plate or of a hollow cylinder. Only the fact that the body belongs to a said crystal class is determining for the embodiment.

In all illustrative embodiments described, the glass fiber 5a, is connected in the given length section (part of the glass fiber bonded to the plate or to the disk) to the piezoelectric body 4 in such a manner that a dimensional change of the pizezoelectric body 4 effected by the inverse piezoelectric effect causes the greatest possible change in the length of the glass fiber 5a. This corresponds to a preferred embodiment of the invention.

The above statement will be clarified by the following consideration. If, for example in an embodiment according to FIG. 6d, the axis a1 is not exactly parallel to the glass fiber 5a but encloses a particular angle with the latter, the fiber-optic sensor, nevertheless, is directionally sensitive in the sense of the invention. However, the glass fiber is elongated to a lesser extent, that is to say not maximally, with a given field strength compared with an alignment of the crystallographic axes shown in FIG. 6d.

In the embodiments which have been explained with reference to FIG. 6a–e, a piezoelectric body 4 in the form of a plate is mentioned for the sake of clear representation. The only reason for this is that a principal surface and a plate normal, that is to say a preferred direction as represented by the body axis, can be easily assigned to a plate. However, it must be emphasized that the invention is not restricted to plate-shaped piezoelectric bodies 4. The body shapes which are possible at all can be derived from the considerations below.

The ideal shape is the ellipsoid since the field in the body is then always homogeneous for electrostatic reasons. In the case of other shapes, lesser or greater field distortions occur at the edge, that is to say in the vicinity of the surface. If the body has three geometric axes of symmetry which are orthogonal with respect to one another, which is the case in the embodiments of Tables I–VI, the influences of the edge effects (field distortions) on the sensor signal mutually compensate each other (for reasons of symmetry).

However, shapes are also possible which do not exhibit any three orthogonal axes of symmetry (for example truncated cone, hemisphere). In that case, certain restrictions with respect to the direction of the glass fiber must be observed.

It must be further noted that the predetermined directional component coincides with a geometric axis of symmetry of the body in the preferred embodiments described. Or, in other words, the preferred crystallographic orientation then always coincides with a geometric axis of symmetry.

Instead of measuring a phase shift of the partial wave by means of a Mach-Zehnder interferometer, any interferometric measuring method can be applied. In particular it corresponds to a preferred embodiment to construct the glass fiber 5a as fiber-optic Fabry-Perot interferometer. Details with respect to the fiber-optic Fabry-Perot interferometer can be seen in the publication by Yoshino et al. initially mentioned.

For the embodiments according to FIG. 6a–e, the glass fiber does not solely have to be connected to the piezoelectric body along a straight line. Curved lines are also permissable.

According to a further particularly preferred embodiment the means for detecting a change in the length of the glass fiber comprise a 2-mode interferometer such as, for example, in the article "Strain effects on highly elliptical core taro-mode fibers", J. N. Blake et al., Optics Letters Vol. 1.12, No.9 (1987), p.732 et seq. or "Use of highly elliptical core fibers for two-mode fiber devices", B. Y. Kim et al, Optics Letters Vol.12, No.9 (1987), p.729 et seq. Although these two-mode interferometers exhibit a much lower sensitivity with respect to the change in length of the glass fiber than a Mach-Zehnder interferometer, it can be very simply and inexpensively implemented.

Similar advantages as the two-mode interferometer are exhibited by a likewise preferred polarization interferometer according to W. Eickhoff, Optics Lett.6, 204, 1981. In this arrangement, two modes which are orthogonally polarized with respect to one another and which experience different phase shifts during the change in length of the glass fiber, are caused to produce interference.

In conclusion, it can be said that the invention creates a fiber-optic sensor for measuring a particular directional component of an electric field which is sensitive and is simple to produce.

What is claimed as new and desired to be secured by Letters Patent of the United States is:

1. Fiber-optic sensor for measuring a predetermined directional component of an electric field, comprising
 (a) a piezoelectric body (4) and
 (b) a glass fiber (5a) which is rigidly connected to the piezoelectric body (4) in a given length section, and
 (c) means for detecting a change in the length of the glass fiber (5a),
wherein
 (d) the piezoelectric body (4) has the shape of a disk,
 (e) the glass fiber (5a) is attached to a disk edge (6) in the given length section,
 (f) the piezoelectric body (4) belongs to one of crystal classes C2v, C4v, C4, C3, C3v, C6, C6v, C∞, C∞v, C2, D3, D3h,
 (g) a disk normal is parallel to the predetermined directional component, and
 (h) the crystallographic orientation, given by a crystallographic axis of rotation which is parallel to the disk normal is selected as follows:

TABLE IV

| Crystal class (Schoenflies [international]) | | Axis of rotation parallel to the disk normal |
| --- | --- | --- |
| C2 | [2] | 2-fold axis |
| C2v | [2 mm] | 2-fold axis |

TABLE IV-continued

| Crystal class (Schoenflies [international]) | | Axis of rotation parallel to the disk normal |
| --- | --- | --- |
| C3 | [3] | 3-fold axis |
| C3v | [3 m] | 3-fold axis |
| D3 | [32] | 2-fold axis |
| D3h | [62 m] | 2-fold axis |
| C4 | [4] | 4-fold axis |
| C6 | [6] | 6-fold axis |
| C∞ | [∞] | ∞-fold axis |
| C4v | [4 mm] | 4-fold axis |
| C6v | [6 mm] | 6-fold axis |
| C∞v | [∞ mm] | ∞-fold axis. |

2. Fiber-optic sensor for measuring a predetermined directional component of an electric field, comprising
 (a) a piezoelectric body (4) and
 (b) a glass fiber (5a) which is rigidly connected to the piezoelectric body (4) in a given length section, and
 (c) means for detecting a change in the length of the glass fiber (5a), wherein
 (d) the piezoelectric body (4) has the shape of a plate or of a hollow cylinder,
 (e) the piezoelectric body (4) belongs to one of crystal classes C2v, C4v, C4, C3, C3v, C6, C6v, C∞, C∞v, C2, D3, D3h, T, Td,
 (f) the glass fiber (5a) is parallel to the predetermined directional component with the given length section, and
 (g) the crystallographic orientation, given by a crystallographic axis of rotation which is parallel to the glass fiber (5a), is selected as follows:

TABLE V

| C[h]rystal class (Schoenflies [international]) | | Axis of rotation parallel to the glass fiber |
| --- | --- | --- |
| C2 | [2] | 2-fold axis |
| C2v | [2 mm] | 2-fold axis |
| C3 | [3] | 3-fold axis |
| C3v | [3 m] | 3-fold axis |
| D3 | [32] | 2-fold axis |
| D3h | [62 m] | 2-fold axis |
| C4 | [4] | 4-fold axis |
| C6 | [6] | 6-fold axis |
| C∞ | [∞] | ∞-fold axis |
| C4v | [4 mm] | 4-fold axis |
| C6v | [6 mm] | 6-fold axis |
| C∞v | [∞ mm] | ∞-fold axis |
| T | [23] | 3-fold axis |
| Td | [43 m] | 3-fold axis |

3. Fiber-optic sensor for measuring a predetermined directional component of an electric field, comprising
 (a) a piezoelectric body (4) and
 (b) a glass fiber (5a) which is rigidly connected to the piezoelectric body (4) in a given length section, and
 (c) means for detecting a change in the length of the glass fiber (5a),
wherein
 (d) the piezo electric body (4) has the shape of a plate,
 (e) the given length section of the glass fiber (5a) is perpendicular to the predetermined directional component,
 (f) the piezoelectric body (4) belongs to one of crystal classes C2, C4v, S4, C4, C6, C∞, C4v, C∞v, D3, D3h, D2, D2d, T, Td, D4, D6, D∞, and
 (g) the crystallographic orientation, given by a crystallographic axis of rotation which is parallel to the predetermined directional component and a direction of the given length section of the glass fiber with respect to a second crystallographic axis of rotation, is selected as follows:

TABLE VIa

| Crystal class (Schoenflies [international]) | | Axis of rotation ∥ or ⊥ to the pre-determined directional component | Inadmissible orientation of the glass fiber |
|---|---|---|---|
| C2 | [2] | ∥ 2-fold axis | d23 cos2α + d21 sin2α + d25 sin2α = 0* |
| S4 | [4̄] | ⊥ and ∥ 4̄-fold axis | tan 2α = −d31/d36** |
| C4 | [4] | ∥ 4-fold axis | |
| X6 | [6] | ∥ 6-fold axis | |
| C∞ | [∞] | ∥ ∞-fold axis | |
| C4v | [4 mm] | ∥ 4-fold axis | |
| C∞v | [∞ mm] | ∥ ∞-fold axis | |
| D3 | [32] | ∥ 2-fold axis | ∥ 3-fold axis*** and tanα = 3d14/d11 |
| D3h | [6̄2 m] | ∥ 2-fold axis | ∥ 3-fold axis |
| D2 | [222] | ∥ 2-fold axis | ∥ 2-fold axis |
| D2d | [4̄2 m] | ∥ 2-fold axis | |
| T | [23] | ∥ 2-fold axis | ∥ 2-fold axis |
| Td | [4̄3 m] | ∥ 4̄-fold axis | ∥ 4̄-fold axis |
| D4 | [422] | ⊥ 4-fold axis | ∥ and ⊥ 4-fold axis |
| D6 | [622] | ⊥ 6-fold axis | ∥ and ⊥ 6-fold axis |
| D∞ | [∞22] | ⊥ ∞-fold axis | ∥ and ⊥ ∞-fold axis |

*α = Angle between Z-axis and glass fiber
**α = Angle between X-axis and glass fiber
***α = Angle between 3-fold axis and glass fiber
dij = Piezoelectric coefficients of expansion
The angle is positive if the axis is rotated in the counter-clockwise direction compared with the glass fiber TABLE VIb

| Crystal class (Schoenflies [international]) | | Axis of rotation or with resp. to the directional component | Direction of the glass fiber for maximum expansion |
|---|---|---|---|
| C2 | [2] | ∥ 2-fold axis | Depending on the ratio of the coefficients of expansion |
| S4 | [4̄] | ∥ 4̄-fold axis | |
| C4 | [4] | ∥ 4-fold axis | |
| C6 | [6] | ∥ 6-fold axis | |
| C∞ | [∞] | ∥ ∞-fold axis | arbitrary |
| C4v | [4 mm] | ∥ 4-fold axis | |

TABLE VIb-continued

| Crystal class (Schoenflies [international]) | | Axis of rotation or with resp. to the directional component | Direction of the glass fiber for maximum expansion |
|---|---|---|---|
| C∞v | [∞ mm] | ∥ ∞-fold axis | |
| D3 | [32] | ∥ 2-fold axis | depending on d14/d11 |
| D3h | [6̄2 m] | ∥ 2-fold axis | ⊥ 3-fold axis |
| D2 | [222] | ∥ 2-fold axis | 45° w.resp. 2-fold axis |
| D2d | [4̄2 m] | ∥ 2-fold axis | |
| T | [23] | ∥ 2-fold axis | 45° w.resp. 2-fold axis |
| Td | [4̄3 m] | ∥ 4-fold axis | 45° w.resp. 4-fold axis |
| D4 | [422] | ⊥ 4-fold axis | 45° w.resp. 4-fold axis |
| D6 | [622] | ⊥ 6-fold axis | 45° w.resp. 6-fold axis |
| D∞ | [∞ 22] | ⊥ ∞-fold axis | 45° w.resp. ∞-fold axis |

4. Fiber-optic sensor as claimed in claim 3 wherein a plate normal is parallel to the predetermined directional component.

5. Fiber-optic sensor as claimed in claim 3, wherein a plate normal is perpendicular to the predetermined directional component.

6. Fiber-optic sensor as claimed in claim 4 or 5, wherein the direction of the given length section of the glass fiber (5a) with respect to the crystallographic orientation is selected in such a manner that a change in the dimensioning of the piezoelectric body (4) causes the greatest possible change in the length of the glass fiber.

7. Fiber-optic sensor as claimed in claim 1, 2 or 3 wherein the piezoelectric body (4) is selected from the group consisting of PVDF, PZT, LiNbO$_3$, GaAs and a-quartz.

8. Fiber-optic sensor as claimed in claim 1, 2 or 3 wherein the means for measuring a change in the length of the glass fiber (5a) comprise a two-mode interferometer or a polarization interferometer.

9. Fiber-optic sensor as claimed in claim 2, wherein the piezoelectric body (4) is selected from the group consisting of PVDF, PZT, LiNbO$_3$, GaAs, and a-quartz.

10. Fiber-optic sensor as claimed in claim 3, wherien the piezoelectric body (4) is selected from the group consisting of PVDF, PZT, LiNbO$_3$, GaAs, and a-quartz.

* * * * *